(12) United States Patent
Kim et al.

(10) Patent No.: US 11,543,376 B2
(45) Date of Patent: Jan. 3, 2023

(54) METHOD FOR MANUFACTURING SAMPLE FOR THIN FILM PROPERTY MEASUREMENT AND ANALYSIS, AND SAMPLE MANUFACTURED THEREBY

(71) Applicant: SEOUL NATIONAL UNIVERSITY R&DB FOUNDATION, Seoul (KR)

(72) Inventors: Ki-Bum Kim, Seoul (KR); Min-Sik Kim, Seoul (KR); Hyun-Mi Kim, Seoul (KR); Ki-Ju Kim, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 777 days.

(21) Appl. No.: 16/326,616

(22) PCT Filed: Jul. 21, 2017

(86) PCT No.: PCT/KR2017/007879
§ 371 (c)(1),
(2) Date: Feb. 19, 2019

(87) PCT Pub. No.: WO2018/034437
PCT Pub. Date: Feb. 22, 2018

(65) Prior Publication Data
US 2021/0278355 A1    Sep. 9, 2021

(30) Foreign Application Priority Data

Aug. 16, 2016   (KR) .................. 10-2016-0103476

(51) Int. Cl.
*H01L 21/306*    (2006.01)
*G01N 27/04*    (2006.01)
(Continued)

(52) U.S. Cl.
CPC ............. *G01N 27/041* (2013.01); *G01N 1/28* (2013.01); *G01N 23/04* (2013.01); *G01N 23/06* (2013.01);
(Continued)

(58) Field of Classification Search
CPC .................................................. H01L 21/30604
See application file for complete search history.

(56) References Cited

U.S. PATENT DOCUMENTS

2011/0204505 A1*   8/2011   Pagaila ............... H01L 23/5389
257/686
2012/0273959 A1*  11/2012   Park ..................... H01L 23/481
257/774

FOREIGN PATENT DOCUMENTS

JP    2003-533676 A    11/2003
JP    2006-105985 A     4/2006
(Continued)

OTHER PUBLICATIONS

Wolf et al.,"Silicon Processing for the VLSI Era, vol. 1—Process Technology", Lattice Press, California, 1986, pp. 521-535.*
(Continued)

*Primary Examiner* — Thomas T Pham
(74) *Attorney, Agent, or Firm* — Hauptman Ham, LLP

(57) ABSTRACT

The present invention relates to a method for manufacturing a sample for thin film property measurement and analysis, and a sample manufactured thereby and, more specifically, to: a method for manufacturing a sample capable of measuring or analyzing various properties in one sample; and a sample manufactured thereby.

9 Claims, 2 Drawing Sheets

(51) Int. Cl.
  *G01N 1/28* (2006.01)
  *G01N 23/04* (2018.01)
  *G01N 23/06* (2018.01)
  *H01L 21/02* (2006.01)
  *H01L 21/304* (2006.01)
  *H01L 21/308* (2006.01)

(52) U.S. Cl.
  CPC ...... *H01L 21/0254* (2013.01); *H01L 21/0262* (2013.01); *H01L 21/02381* (2013.01); *H01L 21/02488* (2013.01); *H01L 21/02527* (2013.01); *H01L 21/02568* (2013.01); *H01L 21/02631* (2013.01); *H01L 21/308* (2013.01); *H01L 21/3046* (2013.01); *H01L 21/30604* (2013.01); *G01N 2223/04* (2013.01); *G01N 2223/418* (2013.01)

(56) References Cited

FOREIGN PATENT DOCUMENTS

| | | |
|---|---|---|
| JP | 2012-252004 A | 12/2012 |
| KR | 10-2013-0019699 A | 2/2013 |
| KR | 10-2014-0021245 A | 2/2014 |

OTHER PUBLICATIONS

International Search Report for PCT/KR2017/007879 dated Sep. 19, 2017.

\* cited by examiner

METHOD FOR MANUFACTURING SAMPLE FOR THIN FILM PROPERTY MEASUREMENT AND ANALYSIS, AND SAMPLE MANUFACTURED THEREBY

CROSS REFERENCE TO RELATED APPLICATION

This present application is a national stage filing under 35 U.S.C § 371 of PCT application number PCT/KR2017/007879 filed on Jul. 21, 2017 which is based upon and claims the benefit of priority to Korean Patent Application No. 10-2016-0103476 filed on Aug. 16, 2016 in the Korean Intellectual Property Office. The disclosures of the above-listed applications are hereby incorporated by reference herein in their entirety.

TECHNICAL FIELD

The present invention relates to a method for manufacturing a sample for thin film property measurement and analysis, and a sample manufactured thereby, and more specifically, to a method for manufacturing a sample capable of measuring various properties or performing analysis in one sample, and a sample manufactured thereby.

BACKGROUND

In recent years, as a size of a semiconductor wafer increases and a display having a large area is required, there is a gradually increasing need to deposit a thin film having a large area and measure or analyze properties of the deposited thin film.

When a thin film such as graphene is deposited on a large area by chemical vapor deposition (CVD) or transferred onto a substrate, it is required to measure and analyze various properties such as electrical characteristics, a grain size, a crystal grain shape, and transmittance, and the like, of graphene in order to evaluate reliability of the thin film. However, in order to measure or analyze the properties of graphene by conventional methods, it is necessary to manufacture different forms of samples depending on respective property measurement and analysis methods.

In order to analyze a structure of graphene through Raman spectroscopy, scanning electron microscope (SEM), or the like, it is necessary to manufacture a sample in which graphene is transferred onto a non-conductor substrate such as silicon oxide ($SiO_2$). However, it is impossible to analyze a nanoscale microstructure through Raman spectroscopy or SEM. In order to observe the nanoscale microstructure, a transmission electron microscope (TEM) should be used. Electrons are needed be transmitted through the sample to perform TEM analysis, and thus a sample for TEM analysis should be separately manufactured. However, it is not easy to measure the electrical properties of the samples for TEM analysis. In addition, in order to measure the transmittance, it is required to manufacture a sample in which graphene is transferred onto a glass substrate. Further, in order to specify the electrical properties of graphene, a field-effect transistor should be manufactured in most cases.

As described above, various forms of samples should be manufactured depending on respective methods for property measurement and analysis, which causes complexity and problems in that it is required to measure properties or analyze a structure of each of regions in which property measurement and analysis are different.

DISCLOSURE

Technical Problem

An object of the present invention is to provide a method for manufacturing a sample capable of measuring various properties and performing analysis in the same region of a thin film in measuring the properties of the thin film or performing analysis.

Another object of the present invention is to provide a sample for thin film property measurement and analysis in which various properties are capable of being measured or analysis is capable of being performed in the same region of a thin film.

Advantageous Effects

According to the present invention, one sample may be manufactured, and various properties of the sample may be measured and a structure, and the like, of the sample may be analyzed in the same region. In other words, electrical properties may be measured through a measurement electrode in the same region of the subject thin film, and the structure analysis of the subject thin film may be performed using the Raman spectroscopy, the scanning electron microscope (SEM), or the atomic force microscope (AFM) in the same region. Further, in a region (membrane region) in which through-hole of a substrate is formed, properties may be measured or analysis may be performed through transmission such as transmittance or transmission electron microscope (TEM), and thus there is no need to manufacture a separate sample for this purpose. Therefore, according to the present invention, it is possible to easily perform more reliable thin film analysis.

DETAILED DESCRIPTION OF EMBODIMENTS

FIGS. 1A to 1H are schematic cross-sectional views schematically explaining a process for performing an embodiment of a method for manufacturing a sample for thin film property measurement and analysis according to the present invention. The drawings shown in FIG. 1 are schematic cross-sectional views showing one unit region and a boundary portion thereof for convenience of explanation, and upon viewing an entire substrate, the unit regions shown in FIG. 1 are repeatedly arranged. Thus, hereinafter, a process for performing an embodiment regarding a method for manufacturing a sample for thin film property measurement and analysis is described with reference to FIG. 1 showing schematic cross-sectional views of the unit region.

Figure 1:
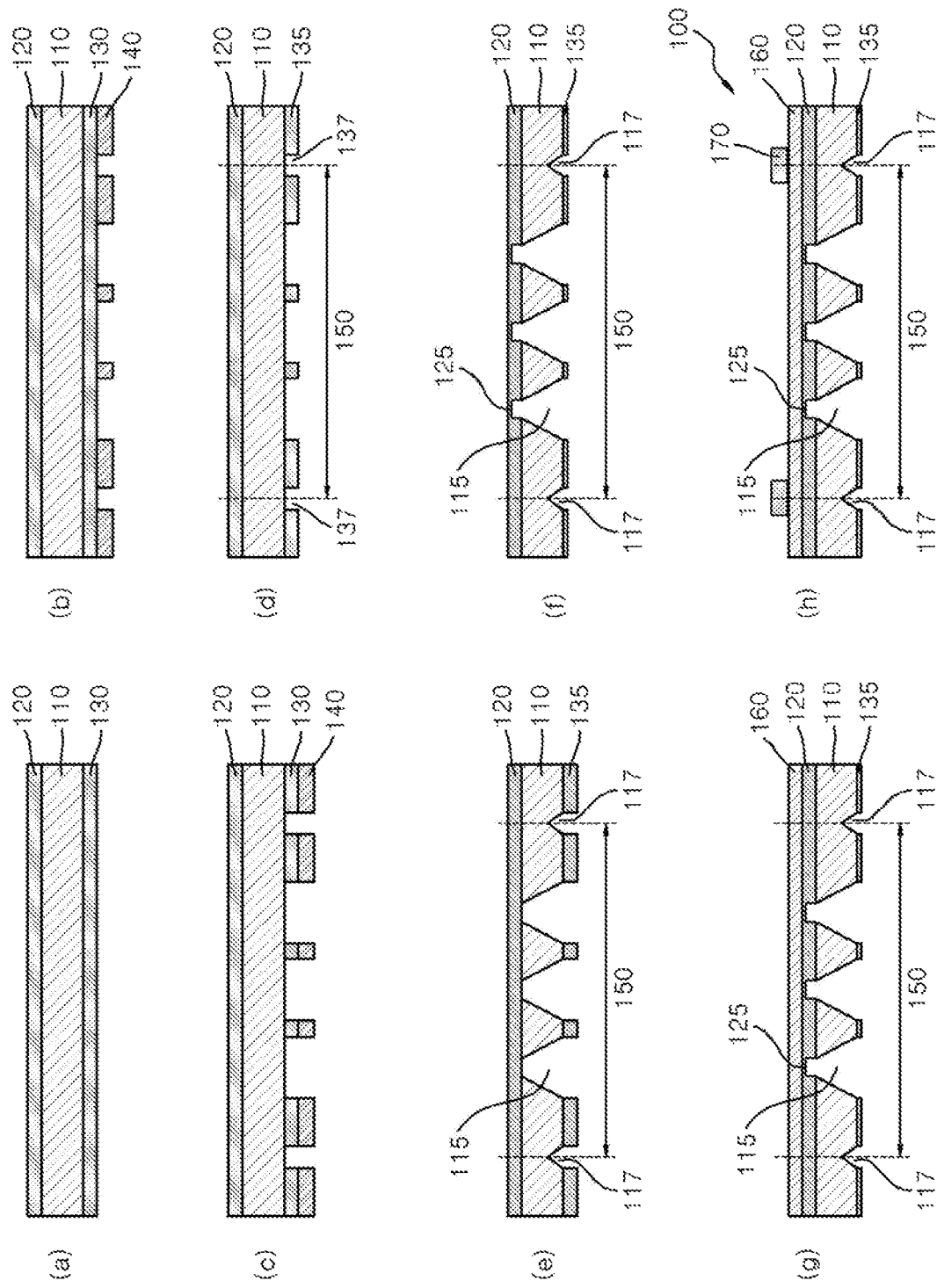
FIGS. 1A to 1H are schematic cross-sectional views schematically explaining a process for performing an embodiment of a method for manufacturing a sample for thin film property measurement and analysis according to the present invention.

Referring to FIG. 1, in an embodiment regarding the method for manufacturing a sample for thin film property measurement and analysis according to the present invention, first, as shown in FIG. 1A, a first layer 120 is formed on a front surface of a substrate 110 and a second layer 130 is formed on a back surface of the substrate 110. Here, the first layer 120 is made of an insulation material. The first layer 120 and the second layer 130 may be formed by one process or may be formed by a separate process. When the first layer 120 and the second layer 130 are formed by the separate process, the order in which the first layer 120 and the second layer 130 are formed does not matter. The first layer 120 may be formed on a front surface of the substrate 110 and then the second layer 130 may be formed on a back surface of the substrate 110, or the second layer 130 may be first formed on the back surface of the substrate 110 and then the first layer 120 may be formed on the front surface of the substrate 110. Preferably, the first layer 120 and the second layer 130 are formed together on the front surface and the back surface of the substrate 110, respectively, using one process. The substrate 110 may be a silicon (Si) substrate, and the first layer 120 and the second layer 130 may be made of silicon nitride, silicon oxide, hafnium oxide, aluminum oxide, or a combination thereof. The first layer 120 and the second layer 130 may be simultaneously formed on the front and back surfaces of the silicon substrate 110 using low pressure chemical vapor deposition (LPCVD). Here, the first layer 120 and the second layer 130 may be formed to have a thickness of about 100 nm.

Next, as shown in FIG. 1B, a photoresist 140 is coated on the second layer 130 and the photoresist 140 is patterned through a photolithography process. In addition, as shown in FIG. 1C, the second layer 130 is etched using the patterned photoresist 140 as a mask, and as shown in FIG. 1D, the photoresist 140 is removed to form a patterned second layer 135. The process of etching the second layer 130 (FIG. 1C) may be performed using reactive ion etching (RIE). A part of the back surface of the substrate 110 is exposed through the processes shown in FIGS. 1B to 1D. A size of the exposed part of the back surface of the substrate 110 may be controlled by the kind of the substrate 110, and a size of a region for property measurement and analysis, and the like, and may be about several hundreds of micrometers ($\mu$m). The patterning of the second layer 130 through the processes shown in FIGS. 1B to 1D may be performed so that a part 150 indicated by the unit region is repeated in the entire region of the substrate 110. In addition, a notch pattern 137 may be formed at the boundary portion between the unit region 150 and the unit region 150.

Next, as shown in FIG. 1E, the substrate 110 is etched through the back surface of the substrate 110 using the patterned second layer 135 as a mask, thereby forming through-holes 115 penetrating the substrate 110. When the substrate 110 is etched through the back surface of the substrate 110 so as to form the through-holes 115 penetrating the substrate 110, a part of a surface of the first layer 120 facing the substrate 110 is exposed. However, even if the first layer 120 is exposed by etching the substrate 110, only the substrate 110 is etched so that is the first layer 120 is not etched together. When the substrate 110 is a silicon substrate and the first layer 120 and the second layer 130 are made of silicon nitride, if anisotropic etching is performed using potassium hydroxide (KOH), as shown in FIG. 1E, only the substrate 110 is etched, and the first layer 120 and the second layer 130 are not etched and the size of the through-hole 115 is reduced from the back surface of the substrate 110 to the front surface of the substrate 110. When the size of the through-hole 115 is reduced from the back surface of the substrate 110 to the front surface of the substrate 110, if a subject thin film to be formed on the front surface of the substrate 110 is provided to perform property measurement and analysis through transmission, which is described below, it is possible to perform more accurate measurement and analysis. In addition, the part of the back surface of the substrate 110 is etched through the notch pattern 137 formed at the boundary portion of the unit region 150. Since the back surface of the substrate 110 exposed by the notch pattern 137 is smaller than the exposed part of the back surface of the substrate 110 in the unit region 150, even if the through-holes 115 penetrating the substrate 110 are formed in the unit region 150, the through-hole 115 is not formed but a notch 117 is formed in the part where the notch pattern 137 is formed. The through-hole 115 may be formed by etching the back surface of the substrate 110 by a chemical etching method, or may be formed by etching the back surface of the substrate 110 using a physical etching method such as sandblast.

Next, as shown in FIG. 1F, the exposed part of the first layer 120 is partly etched through the back surface of the substrate 110. Through this process, a thickness of the first layer 120, which is formed on the region where the through-holes 137 formed in the substrate 110 are formed, is reduced. Hereinafter, a part where the thickness of the first layer 120 is reduced by etching formed on the region where the through-hole 137 is formed is referred to as a membrane 125. The process for etching the part of the first layer 120 may be performed using a reactive ion etching method. When the first layer 120 is silicon nitride and is etched using the reactive ion etching method, it is possible to precisely control the thickness of the membrane 125. The membrane 125 is required to have a thickness sufficient to perform property measurement or analysis through transmission. For example, the membrane 125 is formed by etching the first layer 120 so as to have a thickness sufficient to perform transmittance measurement or transmission electron microscope (TEM) analysis. To this end, the thickness of the membrane 125 may be about 5 to 20 nm. If the thickness of the membrane 125 is thicker than 20 nm, it is not easy to analyze the structure of the subject thin film through TEM. If the thickness of the membrane 125 is thinner than 5 nm, it is not easy to support the subject thin film. Since the membrane 125 is also required to support the subject thin film as described below, if the size of the through-hole 115 is large, the thickness of the etched and remaining part 125 of the first layer 120 is required to be relatively large, whereas if the size of the through-hole 115 is small, the membrane 125 may support the subject thin film even if the thickness of the membrane 125 is relatively thin. Thus, optimum conditions may be selected by controlling the process for patterning the second layer 130, and the thickness of the membrane 125, and the like according to properties to be measured and analysis.

Next, as shown in FIG. 1G, the subject thin film 160 is formed on an upper side of the first layer 120, i.e., on a surface opposite the surface of the first layer 120 facing the substrate 110. The subject thin film 160 is a thin film becoming a subject for property measurement and analysis, and for example, may be graphene, boron nitride (BN), or a metal chalcogen compound (metal dichalcogenide). The metal chalcogen compound may be, for example, a material such as $MoS_2$, $MoSe_2$, $WS_2$, or $WSe_2$. The subject thin film 160 may be formed by various deposition methods such as chemical vapor deposition (CVD), physical vapor deposition (PVD), atomic layer deposition (ALD), and the like, and may be formed by a transfer method when the subject thin film is graphene. The subject thin film 160 may also be formed to have a thickness is sufficient to perform property measurement and analysis through transmission.

Next, as shown in FIG. 1H, a measurement electrode 170 is formed on the subject thin film 160. The measurement electrode 170 is provided to measure electrical properties of the subject thin film 160, and is formed on a periphery of the unit region 150. The measurement electrode 170 may be formed to have a structure capable of being measured by Van der Pauw for sheet resistance analysis or specific resistance analysis. The measurement electrode 170 may be formed using a hard mask, and may be made of gold (Au), silver (Ag), copper (Cu), or a combination thereof. The measurement electrode 170 may further include titanium (Ti), chromium (Cr), or a combination thereof in order to increase adhesive strength between the measurement electrode 170 and the subject thin film 160.

Figure 2:
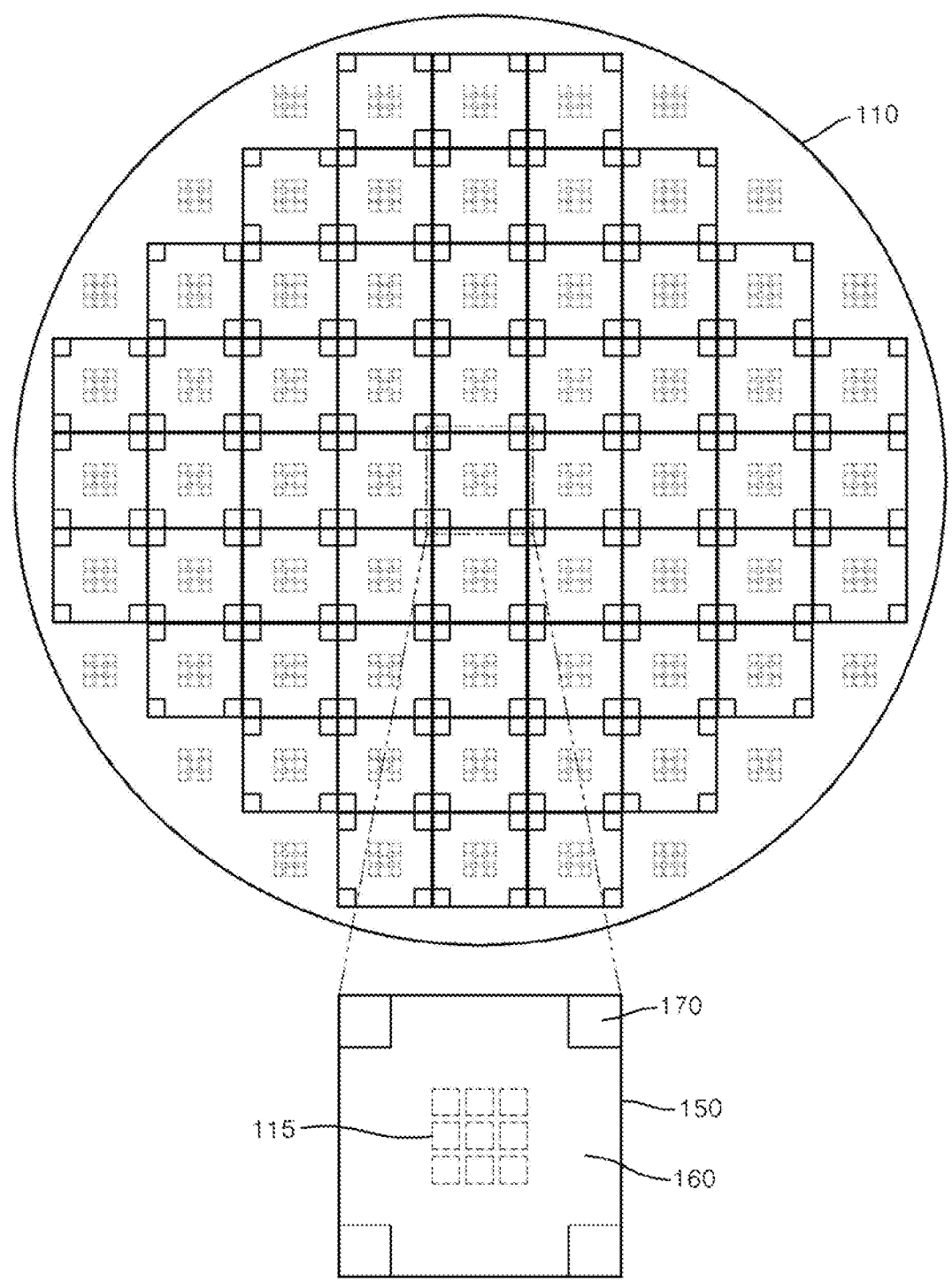
FIG. 2 is a top view of a substrate after performing the process of the embodiment of the method for manufacturing a sample for thin film property measurement and analysis according to the present invention.

FIG. 2 shows a structure viewed from the front surface of the substrate 110 when the sample for thin film property measurement and analysis is manufactured by the methods of FIGS. 1A to 1H. FIG. 2 shows a case where nine through-holes 115 are arranged in a 3×3 matrix at the center of one unit region 150. In the respective regions where the through-holes 115 are formed, parts corresponding to the membranes 125 of the first layer 120 are formed. Thus, it is possible to perform property measurement or analysis through transmission from the regions where the through-holes 115 are formed. One unit region 150 may have an area of about several $mm^2$ to several $cm^2$, and the through-hole 115 in the front surface portion of the substrate 110 has a size of about 20 to 200 μm and an interval between the through-holes 115 is about several hundreds of micrometers (μm). As shown in FIG. 2, the unit region 150 may have a square shape, and four measurement electrodes 170 may be formed in the vicinity of the edge of the unit region 150 so as to be measurable by Van der Pauw. The unit region 150 may be easily split by the notch 137 formed on the back surface of the substrate 110. The split unit region 150 described above may be one sample for thin film property measurement and analysis.

The sample 100 for thin film property measurement and analysis formed by the method described above includes a substrate 110, a first layer 120, a subject thin film 160, and a measurement electrode 170, as shown in FIG. 1H.

The substrate 110 may be a silicon substrate as described above and a through-hole 115 is formed in the substrate 110, the through-hole penetrating through a front surface and a back surface of the substrate 110. The through-hole 115 may have a size of about 20 to 200 μm, and a plurality of through-holes 115 are arranged in one sample 100. The number of the through-holes 115 may be controlled through the subject thin film 160 according to a purpose to be measured or analyzed.

The first layer 120 is formed on the front surface of the substrate 110 and is made of an insulation material such as silicon nitride, silicon oxide, hafnium oxide, or aluminum oxide as described above. A membrane 125 is formed in a region where the through-hole 115 of the substrate 110 is formed, and the membrane 125 has a thickness sufficient to perform property measurement and analysis through transmission. For example, the membrane 125 has a thickness sufficient to perform transmittance measurement or TEM analysis.

The subject thin film 160 is formed on the first layer 120, is a thin film becoming a subject for property measurement and analysis, and may be graphene, boron nitride (BN), or a metal chalcogen compound (metal dichalcogenide). The metal chalcogen compound may be, for example, a material such as $MoS_2$, $MoSe_2$, $WS_2$, or $WSe_2$. The subject thin film 160 may also be formed to have a thickness sufficient to perform property measurement and analysis through transmission.

The measurement electrode 170, which is formed on the subject thin film 160, is provided to measure electrical properties of the subject thin film 160, and is formed on a periphery of the sample 100. The measurement electrode 170 may be formed to have a structure capable of being measured by Van der Pauw for sheet resistance analysis or specific resistance analysis. The measurement electrode 170 may be formed using a hard mask, and may be made of gold (Au), silver (Ag), copper (Cu), or a combination thereof. The measurement electrode 170 may further include titanium (Ti), chromium (Cr), or a combination thereof in order to increase adhesive strength between the measurement electrode 170 and the subject thin film 160.

In the sample 100 for thin film property measurement and analysis, it is possible to measure electrical characteristics in one sample through Van der Pauw measurement, or the like, to perform analysis in the same sample through Raman spectroscopy, SEM, or AFM, and to perform analysis through transmittance measurement or TEM in the membrane 125 region of the same sample. Therefore, it is possible to perform various forms of property measurement and analysis in the same region, thereby enabling more reliable quality evaluation of the thin film.

The invention claimed is:

1. A method for manufacturing a sample for thin film property measurement and analysis, the method comprising:
    forming a first layer made of an insulation material on a front surface of a substrate;
    forming a second layer on a back surface of the substrate;
    patterning the second layer;
    etching the back surface of the substrate by using the patterned second layer as a mask so as to form a through-hole penetrating through the front surface and the back surface of the substrate, thereby exposing at least one part of a first surface of the first layer facing the substrate;
    partially etching the exposed part of the first layer through the back surface of the substrate, wherein the exposed part of the first layer is etched to have a thickness of 5 to 20 nm; and
    forming a subject thin film on a second surface of the first layer that is opposite the first surface of the first layer facing the substrate.

2. The method of claim 1, wherein the through-hole in the front surface portion of the substrate has a size of 20 to 200 μm.

3. The method of claim 1, wherein the through-hole is formed by a chemical etching method or a physical etching method.

4. The method of claim 1, wherein the forming of the first layer and the forming of the second layer are performed together.

5. The method of claim 4, wherein the substrate is a silicon (Si) substrate,
    the first layer and the second layer include at least one of silicon nitride, silicon oxide, hafnium oxide, and aluminum oxide, and
    the substrate is etched with potassium hydroxide (KOH).

6. The method of claim 1, wherein in the patterning of the second layer, the patterning is performed so that pattern in a unit region is repeated, and a notch pattern is formed between the unit region and an adjacent unit region so that a notch is capable of being formed at the time of etching the back surface of the substrate.

7. The method of claim 1, further comprising:
   forming a measurement electrode for measuring electrical property on the subject thin film.

8. The method of claim 7, wherein the measurement electrode is formed to have a structure capable of being measured by Van der Pauw.

9. The method of claim 1, wherein the subject thin film is any one of graphene, boron nitride (BN), and a metal chalcogen compound.

* * * * *